(12) United States Patent
Tenbroek et al.

(10) Patent No.: US 10,177,744 B2
(45) Date of Patent: Jan. 8, 2019

(54) WIRELESS COMMUNICATION UNIT, INTEGRATED CIRCUIT AND METHOD FOR ANTENNA TUNING

(71) Applicant: MediaTek Singapore Pte. Ltd., Singapore (SG)

(72) Inventors: Bernard Mark Tenbroek, West Malling (GB); Walid Youssef Ali-Ahmad, Beirut (LB)

(73) Assignee: MediaTek Singapore Pte. Ltd., Solaris (SG)

( * ) Notice: Subject to any disclaimer, the term of this patent is extended or adjusted under 35 U.S.C. 154(b) by 473 days.

(21) Appl. No.: 14/612,297

(22) Filed: Feb. 3, 2015

(65) Prior Publication Data

US 2016/0126619 A1  May 5, 2016

Related U.S. Application Data

(60) Provisional application No. 62/072,454, filed on Oct. 30, 2014.

(51) Int. Cl.
| | |
|---|---|
| *H01Q 1/50* | (2006.01) |
| *H03J 7/04* | (2006.01) |
| *H03H 7/40* | (2006.01) |
| *H04B 17/10* | (2015.01) |
| *H01Q 13/10* | (2006.01) |
| *H01Q 9/04* | (2006.01) |
| *H04B 17/12* | (2015.01) |
| *H04B 1/04* | (2006.01) |

(Continued)

(52) U.S. Cl.
CPC ............... *H03J 7/04* (2013.01); *H01Q 5/50* (2015.01); *H01Q 9/0442* (2013.01); *H01Q 13/103* (2013.01); *H03H 7/40* (2013.01); *H04B 1/0458* (2013.01); *H04B 1/18* (2013.01); *H04B 17/102* (2015.01); *H04B 17/12* (2015.01)

(58) Field of Classification Search
CPC .................................. H01Q 1/50; H01Q 5/50
USPC .......................................................... 343/745
See application file for complete search history.

(56) References Cited

U.S. PATENT DOCUMENTS

| | | | | |
|---|---|---|---|---|
| 4,041,395 | A | * | 8/1977 | Hill ........................ H03H 11/30 |
| | | | | 324/140 D |
| 5,778,308 | A | * | 7/1998 | Sroka ....................... H03H 7/40 |
| | | | | 333/17.3 |

(Continued)

FOREIGN PATENT DOCUMENTS

| | | |
|---|---|---|
| EP | 3130080 A1 | 2/2017 |
| WO | 2015157085 A1 | 10/2015 |

OTHER PUBLICATIONS

Komulainen, A Frequency Tuning Method for a Planar Inverted-F Antenna, IEEE Transactions on Antennas and Propagation, vol. 56, No. 4, pp. 944-950, Apr. 2008.

*Primary Examiner* — Dameon E Levi
*Assistant Examiner* — Ab Salam Alkassim, Jr.
(74) *Attorney, Agent, or Firm* — Optimus Patents US, LLC (57) ABSTRACT

A wireless communication unit includes an antenna arrangement; an aperture tuner operably coupled to a first port of the antenna arrangement; a measurement circuit operably coupled to an antenna input feed point of the antenna arrangement and arranged to measure a parameter. A controller, operably coupled to the aperture tuner, is arranged to perform closed loop aperture tuning using the measured parameter.

13 Claims, 6 Drawing Sheets

(51) Int. Cl.
*H04B 1/18* (2006.01)
*H01Q 5/50* (2015.01)

(56) References Cited

U.S. PATENT DOCUMENTS

| | | | | |
|---|---|---|---|---|
| 6,029,051 | A * | 2/2000 | Osterberg | G01R 27/28 324/142 |
| 6,710,651 | B2 * | 3/2004 | Forrester | H03G 3/001 330/129 |
| 6,747,956 | B1 * | 6/2004 | Darack | H04W 24/00 370/241 |
| 7,180,467 | B2 * | 2/2007 | Fabrega-Sanchez | G01R 27/2694 343/861 |
| 8,159,399 | B2 | 4/2012 | Dorsey | |
| 8,606,198 | B1 * | 12/2013 | Wright | H01P 5/18 333/109 |
| 8,611,834 | B2 * | 12/2013 | Harris | H03F 1/56 455/107 |
| 9,031,523 | B2 * | 5/2015 | Anderson | G01R 29/10 455/107 |
| 9,084,124 | B2 * | 7/2015 | Nickel | H04W 24/00 |
| 9,627,753 | B2 * | 4/2017 | Caimi | H01Q 5/22 |
| 9,640,863 | B2 * | 5/2017 | Shen | H01Q 1/50 |
| 9,680,220 | B2 * | 6/2017 | Rabe | H01Q 5/22 |
| 9,692,124 | B2 * | 6/2017 | Caimi | H01Q 5/22 |
| 9,742,076 | B2 * | 8/2017 | Jenwatanavet | H01Q 21/06 |
| 9,843,307 | B2 * | 12/2017 | Feldman | H03J 7/02 |
| 9,941,593 | B2 * | 4/2018 | Ozdemir | H01Q 9/0442 |
| 9,960,801 | B2 * | 5/2018 | Mow | H04B 1/40 |
| 9,985,338 | B2 * | 5/2018 | Choon | H01Q 1/243 |
| 10,055,126 | B2 * | 8/2018 | Quinn | G06F 3/0601 |
| 2005/0088358 | A1 * | 4/2005 | Larry | H01Q 1/36 343/833 |
| 2005/0215281 | A1 * | 9/2005 | Oodaira | H04B 1/18 455/553.1 |
| 2006/0132360 | A1 | 6/2006 | Caimi | |
| 2009/0046030 | A1 * | 2/2009 | Song | H03J 3/06 343/852 |
| 2013/0127670 | A1 | 5/2013 | Desclos | |
| 2013/0335280 | A1 | 12/2013 | Chen, III et al. | |
| 2014/0320376 | A1 * | 10/2014 | Ozdemir | H01Q 9/0442 343/876 |
| 2015/0119045 | A1 * | 4/2015 | Montgomery | H01Q 5/22 455/437 |
| 2015/0326254 | A1 * | 11/2015 | Feldman | H04B 1/006 455/83 |
| 2015/0372656 | A1 * | 12/2015 | Mow | H03H 7/38 455/77 |
| 2016/0028375 | A1 * | 1/2016 | Feldman | H03J 7/02 455/193.1 |
| 2016/0126623 | A1 * | 5/2016 | Maxim | H01L 23/315 343/860 |
| 2016/0204820 | A1 * | 7/2016 | Mow | H04B 1/40 455/575.7 |
| 2017/0019137 | A1 * | 1/2017 | Parkhurst | H04B 1/0458 |
| 2017/0054220 | A1 * | 2/2017 | Jenwatanavet | H01Q 21/06 |
| 2017/0302326 | A1 * | 10/2017 | Mow | H04B 1/40 |
| 2017/0346178 | A1 * | 11/2017 | Shi | H04B 17/102 |
| 2017/0358838 | A1 * | 12/2017 | Huang | H04W 4/70 |
| 2018/0026369 | A1 * | 1/2018 | Kim | H04B 17/12 |
| 2018/0083344 | A1 * | 3/2018 | Han | H01Q 1/243 |
| 2018/0204101 | A1 * | 7/2018 | De Jongh | G06K 19/0725 |

* cited by examiner

WIRELESS COMMUNICATION UNIT, INTEGRATED CIRCUIT AND METHOD FOR ANTENNA TUNING

CROSS REFERENCE TO RELATED APPLICATIONS

This application claims the benefit of U.S. provisional application No. 62/072,454, filed on Oct. 30, 2014 and incorporated herein by reference.

FIELD OF THE INVENTION

The field of this invention relates generally to the field of wireless communications. In particular, the field of this invention relates to a wireless communication unit, a radio frequency integrated circuit and method for closed loop aperture tuning of an antenna arrangement.

BACKGROUND OF THE INVENTION

As new generations of handsets, gateways, and other wireless communication devices become embedded with more applications, and the need for increased bandwidth becomes greater, new antenna systems are required to optimise link quality. Specifically, better control of the radiated field is required to provide better communication link quality with intended transceivers, whilst suppressing signals from undesired transceivers. Typically, during normal operation of a wireless communication device, impedance and/or frequency changes at the antenna create mismatches. It is known that such impedance mismatches and/or frequency resonance mismatches have a significant impact on the power transfer through the antenna system. For example, such mismatches may occur if the antenna is moved and repositioned near a reflective or (radio frequency) absorbent material, or if the antenna is positioned closer or further away from, say, a head of a user. Maximising energy transfer through antenna systems is a key desirable performance criteria and intelligent and adaptable antenna systems to address such mismatches are needed.

Antennas are transition devices (e.g. a form of transducer) that function between guided waves and free space waves. There are two primary forms of tuning in antennas: antenna aperture tuning, which adds components at the antenna aperture or ground point to adjust the antenna resonance frequency, and antenna impedance tuning, which is executed by adjusting the impedance matching at the antenna feed point.

Figure 1:
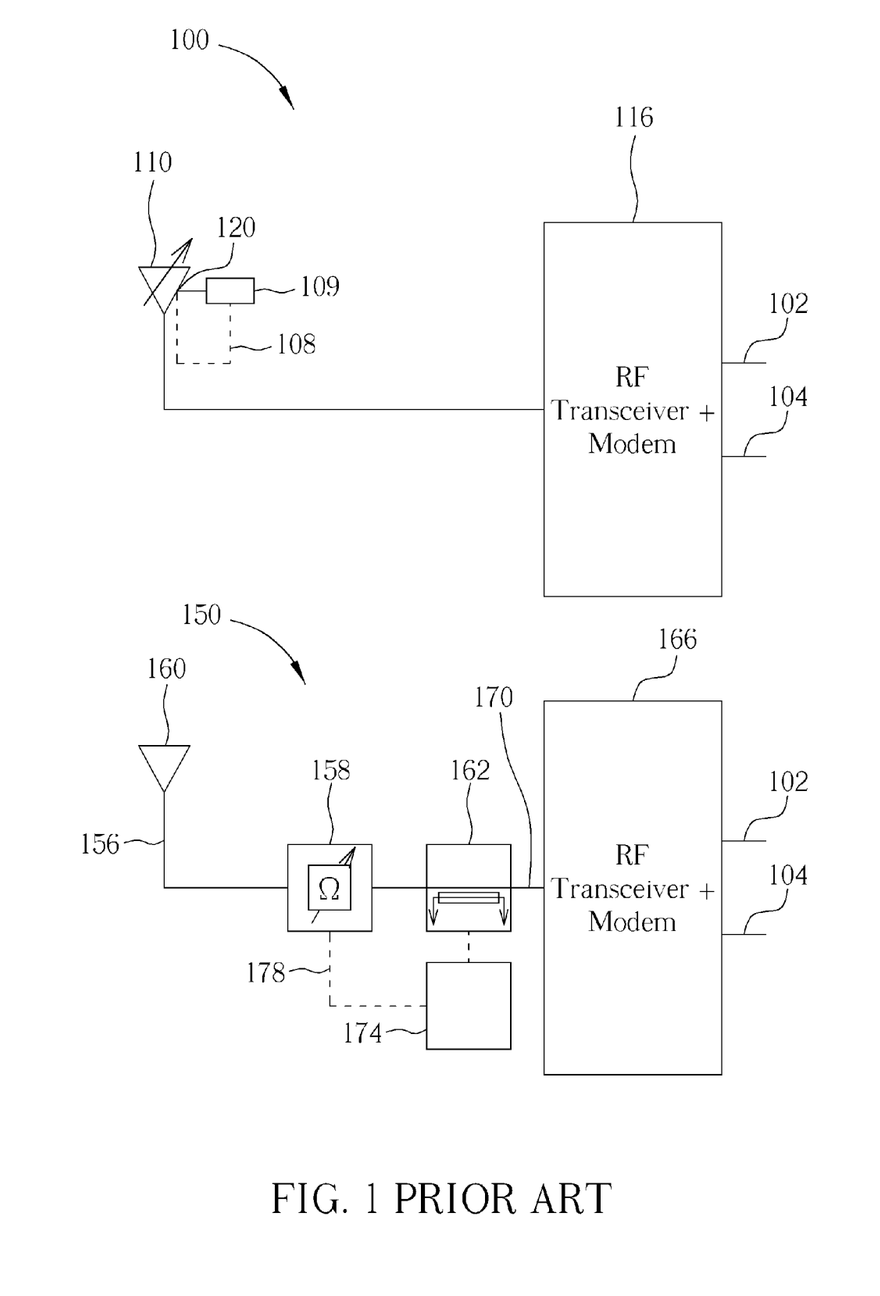
FIG. 1 illustrates known impedance matching and frequency resonance tuning circuits.

Referring to FIG. 1, implementation details of the different techniques of antenna aperture tuning and antenna impedance tuning are illustrated. A first device 100 comprises a tunable antenna 110 with an aperture tuner 109. An aperture tuner 109 optimizes the radiation efficiency of the antenna system. Radio frequency (RF) transceiver and modem circuit 116 comprises a transmit input path 102 for generating signals to be radiated by the antenna 110 and a receiver output path 104 to carry signals that have been received by the antenna and are subsequently processed.

Frequency resonance mismatches are a particular problem, as they can adversely affect an antenna's radiation efficiency and bandwidth. Therefore, in this document, aperture tuner 109 is arranged to perform a limited form of closed loop 108 aperture tuning with measurements made at the aperture tuning connection point 120. Notably, with most known aperture tuning arrangements, open loop measurements are made, as illustrated in FIG. 2.

A second known antenna tuner technique 150 comprises an antenna 160 operably coupled to an impedance tuner 158 via an antenna feed 156. The impedance tuner 158 is operably coupled to a coupler 162 to extract portions of signals passing there through to facilitate impedance measurements. In this arrangement, a controller 174 is operably coupled to coupler 162 and arranged to receive representations of forward power and reverse power to enable the controller to determine impedance measurement information. The controller 174 is operably coupled to impedance tuner 158 via control line 178 and arranged to adjust the tuner to provide an optimal match to the antenna impedance in response to the impedance measurement information. In this manner, the antenna tuner technique 150 is arranged to perform closed loop control of the antenna impedance matching. Antenna impedance tuning attempts to optimize the power transfer between the transmission line feed and the antenna element.

The coupler 162 is operably coupled to RF transceiver and modem circuit 166 via RF path 170. RF transceiver and modem circuit 166 comprises a transmit input path 102 and a receiver output path 104. Impedance mismatches between the antenna 160 and the RF transceiver and modem circuit 166, as well as objects close to the antenna 160 that affect the radiation field, can cause further undesirable losses. Thus, to reduce some of these losses, it is known to utilise coupler 162, controller 174 and impedance tuner 158 in a closed loop impedance matching network, in order to compensate for any impedance mismatches.

Figure 2:
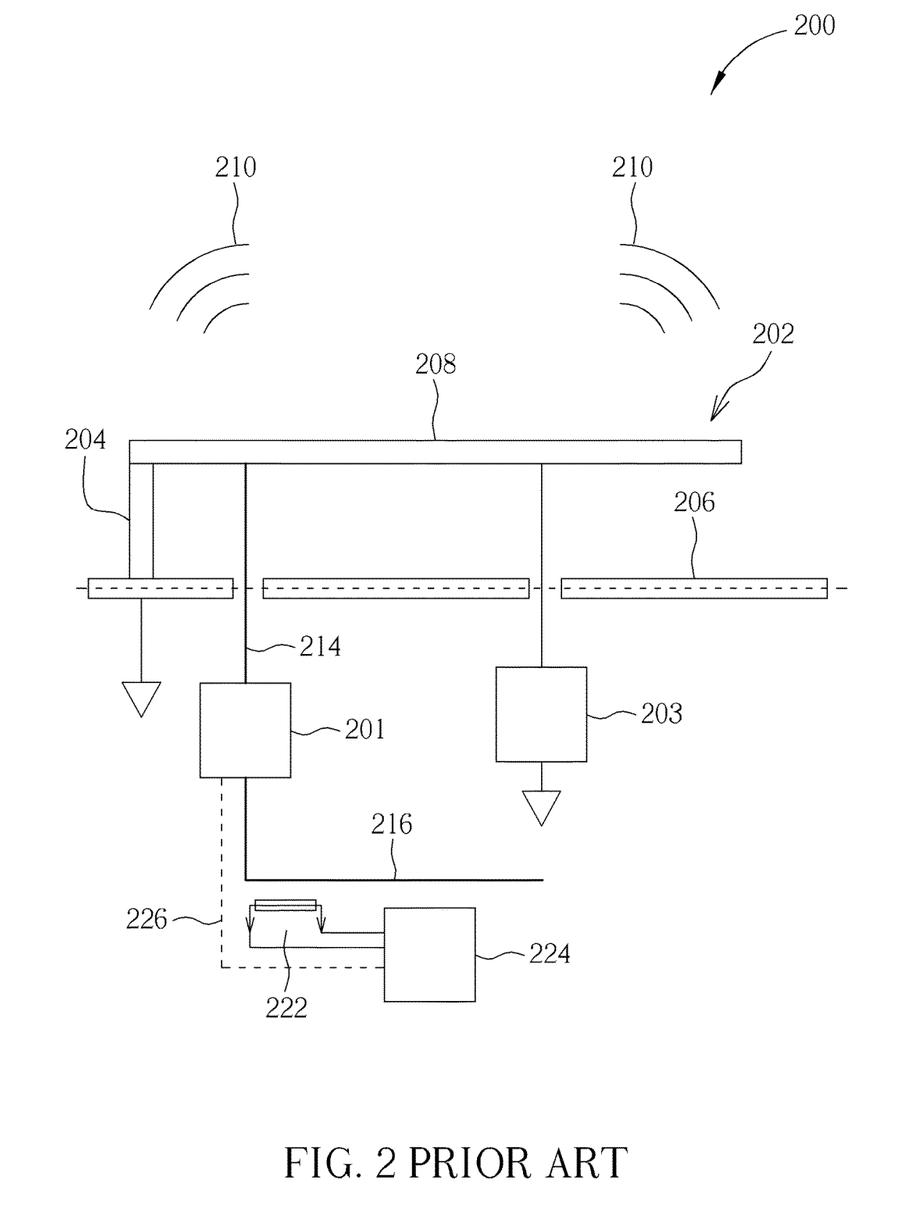
FIG. 2 illustrates a known multi-band PIFA.

Referring to FIG. 2, a known antenna arrangement 200 for a wireless communication unit is illustrated. The antenna arrangement 200 is a Planar Inverted-F Antenna (PIFA) 202, which is a common antenna arrangement used for smartphones. The PIFA 202 comprises a shorting pin 204 that couples the PIFA 202 to a ground plane 206. The PIFA 202 comprises a radiating element 208 arranged to radiate/receive free space waves 210.

In this PIFA 202, aperture tuning is performed by an aperture tuner 203 that couples the PIFA 202 to a ground plane 206. The aperture tuning operation is performed by optimizing the radiation efficiency from the antenna terminals into free space by tuning the antenna resonance frequency. Aperture tuning is performed at a point that is distal from the antenna feed point 214 and is usually performed open loop using look-up tables for the aperture tuning state (i.e. with no feedback information to influence the tuning operation in a real-time manner).

Impedance matching for the PIFA 202 is performed by impedance matching circuit 201, which presents a suitably adjusted impedance at antenna feed point 214. The antenna impedance tuning is arranged to optimize power transfer to/from the transmission line 216, e.g. in a form of a guided wave, from/to the antenna element(s) by tuning the impedance matching circuit 201. A main signal connection is coupled to antenna feed point 214 via impedance matching circuit 201, with a small portion extracted by directional coupler 222, and the resulting forward and reverse (reflected) signals are measured using measurement unit 224. The measurement unit 224 is then able to adjust, via a control signal applied to path 226, one or more variable component(s) in the impedance matching circuit 201 to adjust the impedance match between transmission line 216 and antenna feed point 214.

Figure 3:
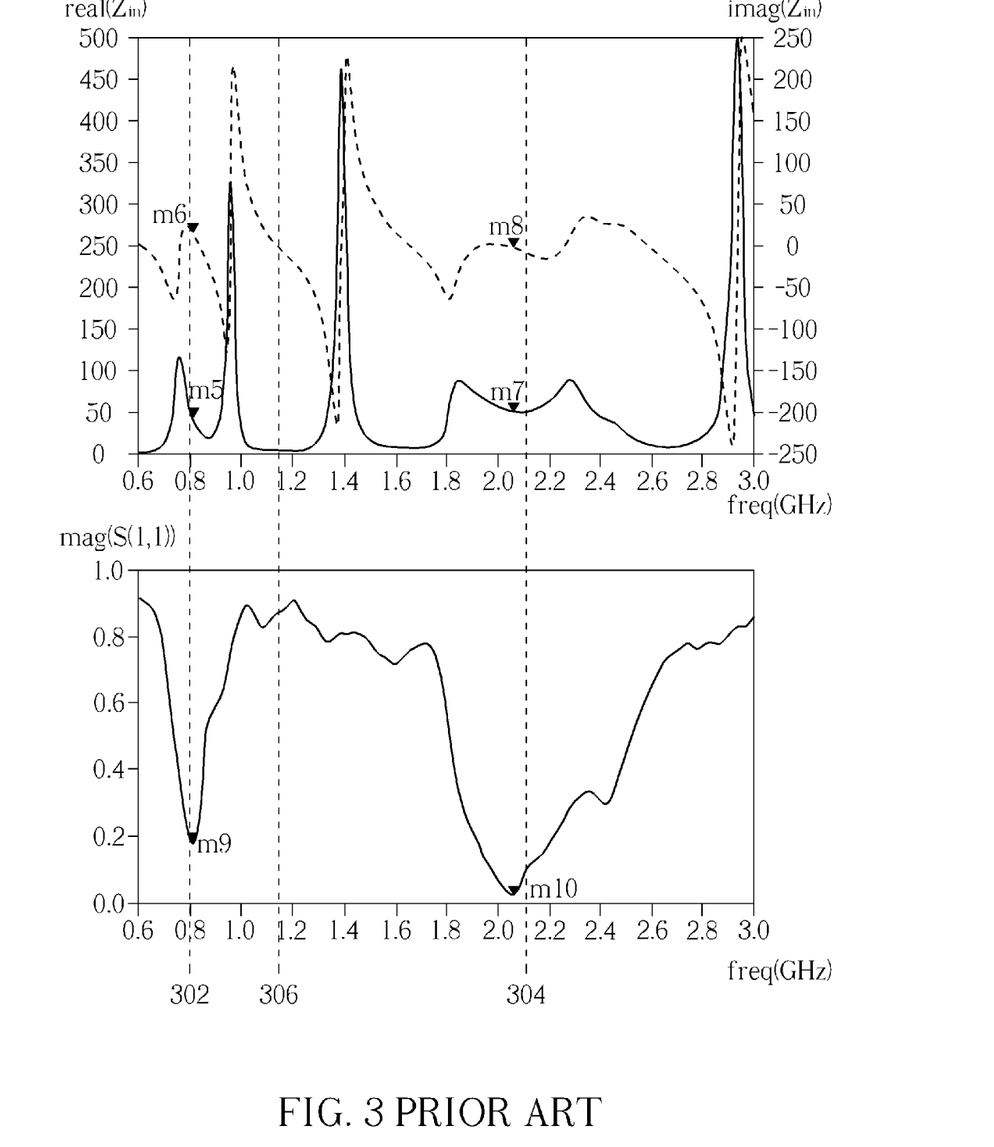
FIG. 3 illustrates measurement data for a multi-band PIFA that shows that multiple resonances may occur.

Referring to FIG. 3, an antenna resonance occurs when the imaginary part of the antenna input impedance is zero (imag{Zin}~0). To achieve good antenna efficiency it is not sufficient that the antenna is in resonance, indicated by imag{Zin}~0, but simultaneously the real part of the antenna input impedance should be close to the characteristic impedance of the transmission line connected to the antenna feed point, which is typically 50Ω (real{Zin}~50Ω). The PIFA antenna in FIG. 3 exhibits multiple antenna resonances (twelve in this example) as indicated by the zero crossings of the imag(Zin) curve in the top plot. For many of these resonances the real part of the antenna input impedance real{Zin} is far from 50Ω, for example for the resonance at 306 where the real (Zin) is close to zero. However, as shown, two resonances, one low-band (LB) 302 and one high band (HB) 304 exhibit a real input impedance close to 50Ω. Note that these two optimum resonances correspond to a condition where the input reflection or S11 at the antenna feed point is low as illustrated in the bottom plot in FIG. 3. Hence, in implementing aperture tuning, such as by aperture tuner 203 of FIG. 2, selecting an optimal resonance for a particular impedance is problematic.

Therefore, known techniques for compensating for antenna resonance frequency detuning and antenna impedance mismatches are typically not sufficient to result in adequate antenna efficiency over a required wide bandwidth. Therefore, there may be a need to provide a different antenna tuner technique.

SUMMARY

Accordingly, the invention seeks to mitigate, alleviate or eliminate one or more of the above mentioned disadvantages singly or in any combination. Aspects of the invention provide a wireless communication unit and a radio frequency integrated circuit comprising an antenna tuning module and a method therefor, as described in the appended claims.

In accordance with a first aspect of the invention, a wireless communication unit comprises an antenna arrangement; an aperture tuner operably coupled to a first port of the antenna arrangement; a measurement circuit operably coupled to an antenna input feed point of the antenna arrangement that is distal from the first port coupled to the aperture tuner and arranged to measure a parameter, and a controller, operably coupled to the aperture tuner and arranged to perform closed loop aperture tuning using the measured parameter.

In this manner, a mechanism is provided whereby a measurement of a parameter related to the aperture tuner performance is made at the antenna feed point, notably distal from the aperture tuner. Thereafter, a closed loop tuning approach to tune the aperture may be performed based on the measured parameter, in contrast to the known open-loop aperture tuning techniques.

Furthermore, in applying a closed loop approach to aperture tuning, examples of the invention propose a new approach to determining an optimal antenna resonance by avoiding resonance for which the real part of the antenna input impedance may be far from 50Ω. Examples of the invention may therefore provide a more optimum antenna frequency tuning operation by performing a minimum measured reflection value search, since this will result in optimum antenna efficiency. In this regard, aperture tuner may be subjected to a series of tuning operations.

In some optional examples, the measurement circuit may be arranged to measure the parameter representing an antenna input complex impedance value or a reflection coefficient value associated with the antenna arrangement. In this manner, the measured parameter may be representative of the aperture tuner performance.

In some optional examples, the measurement circuit may be arranged to determine whether a change in the antenna input impedance value or the reflection coefficient value exceeds a threshold and in response thereto the controller triggers an aperture tuning operation. In some optional examples, the controller may be arranged to trigger an aperture tuning operation based on at least one from a group of: a change of use of the communication unit, a frequency band change. In this manner, the aperture tuning operation may be performed in response to a stimulus, such as a change of use or change of an operational frequency band.

In some optional examples, the closed loop aperture tuning may be performed continuously to optimize antenna tuner input impedance. In this manner, the aperture tuning operation may be continuously and iteratively tuned and the performance improved.

In some optional examples, the wireless communication unit may further comprise an impedance matching module operably coupled to the measurement circuit and the antenna input feed point and arranged to perform impedance matching of signals applied to or emanating from the antenna arrangement. In some optional examples, an impedance match value may be applied by the impedance tuning module and may also be tuned in a closed loop manner based on the measured parameter. In some optional examples, the closed loop aperture tuning may perform a first coarse tuning operation and the optional impedance tuning may perform a second fine tuning operation for signals routed to or from the antenna arrangement. In this manner, in some examples, an antenna that is determined as being off-resonance may be first retuned back to resonance by aperture tuning, thereby providing a coarse tuning operation, before applying impedance tuning (e.g. fine tuning) to correct for any mismatch loss.

In some optional examples, the wireless communication unit may further comprise at least one sensor operably coupled to the controller, such that the controller may be arranged to initiate antenna input impedance measurements or reflection coefficient measurements performed by the measurement circuit in response to a sensed signal. In this manner, the closed loop aperture and/or mismatch tuning may be instigated by an external stimulus, triggered by one or more sensors.

In some optional examples, the measurement circuit may comprise: a directional coupler arranged to extract a portion of the signals being passed to and reflected from the antenna arrangement; and a signal detector arranged to provide a measurement of the parameter based on said portion of the signals.

In accordance with a second aspect of the invention, a method of antenna tuning in a wireless communication unit comprising an antenna arrangement operably coupled to an aperture tuner is described. The method comprises: routing a signal to or from the antenna arrangement via an antenna input feed point of the antenna arrangement; measuring a parameter of the routed signal at a measurement circuit operably coupled to the antenna input feed point of the antenna arrangement; and performing closed loop aperture tuning of an aperture tuner based on the measured parameter, wherein the aperture tuner is connected to a first port of the antenna arrangement distal from the antenna input feed point.

In some optional examples, measuring a parameter may comprise measuring a parameter representing an antenna input complex impedance value or a reflection coefficient value associated with the antenna arrangement. In this manner, the measured parameter may be representative of the aperture tuner performance.

In some optional examples, measuring a parameter may further comprise determining whether a change in the antenna input impedance value or the reflection coefficient value exceeds a threshold and in response thereto the controller triggers an aperture tuning operation. In this manner, the aperture tuning operation may be performed in response to a stimulus, such as a change of use or change of an operational frequency band.

In some optional examples, the method may further comprise determining whether a change in the antenna input impedance value or the reflection coefficient value exceeds a threshold; and triggering an aperture tuning operation in response thereto.

In some optional examples, the method may further comprise triggering an aperture tuning operation based on at least one from a group of: a change of use of the communication unit, a frequency band change.

In some optional examples, the method may further comprise additionally performing closed loop impedance match tuning of an impedance matching circuit operably coupled to the antenna input feed point based on the measured parameter.

In accordance with a third aspect of the invention, a radio frequency integrated circuit for a wireless communication unit comprising an antenna arrangement is described. The radio frequency integrated circuit comprises: an aperture tuner operably couplable to a first port of the antenna arrangement; and a measurement circuit operably couplable to an antenna input feed point of the antenna arrangement that is distal from the first port coupled to the aperture tuner and arranged to measure a parameter; wherein the aperture tuner is subjected to closed loop aperture tuning based on the measured parameter.

In some optional examples, the measured parameter may comprise at least one of: antenna input complex impedance value, antenna input complex reflection coefficient, reflection coefficient magnitude.

In some optional examples, the radio frequency integrated circuit may further comprise an impedance tuning module operably coupled to the measurement circuit and an antenna input of the antenna arrangement wherein an impedance match value applied by the impedance tuning module may be tuned in a closed loop manner based on the measured parameter.

These and other aspects of the invention will be apparent from, and elucidated with reference to, the embodiments described hereinafter.

BRIEF DESCRIPTION OF THE DRAWINGS

Further details, aspects and embodiments of the invention will be described, by way of example only, with reference to the drawings. Elements in the figures are illustrated for simplicity and clarity and have not necessarily been drawn to scale. Like reference numerals have been included in the respective drawings to ease understanding.

DETAILED DESCRIPTION

Examples of the invention will be described in terms of a wireless communication unit such as a smartphone, and an aperture tuner and method of antenna tuning therefor. Although examples of the invention will be described in terms of one or more integrated circuits for use in such a wireless communication unit, it will be appreciated by a skilled artisan that the inventive concept herein described may be embodied in any type of integrated circuit, wireless communication unit or wireless device having an antenna that could benefit from improved power efficiency and wider operating bandwidth.

Figure 4:
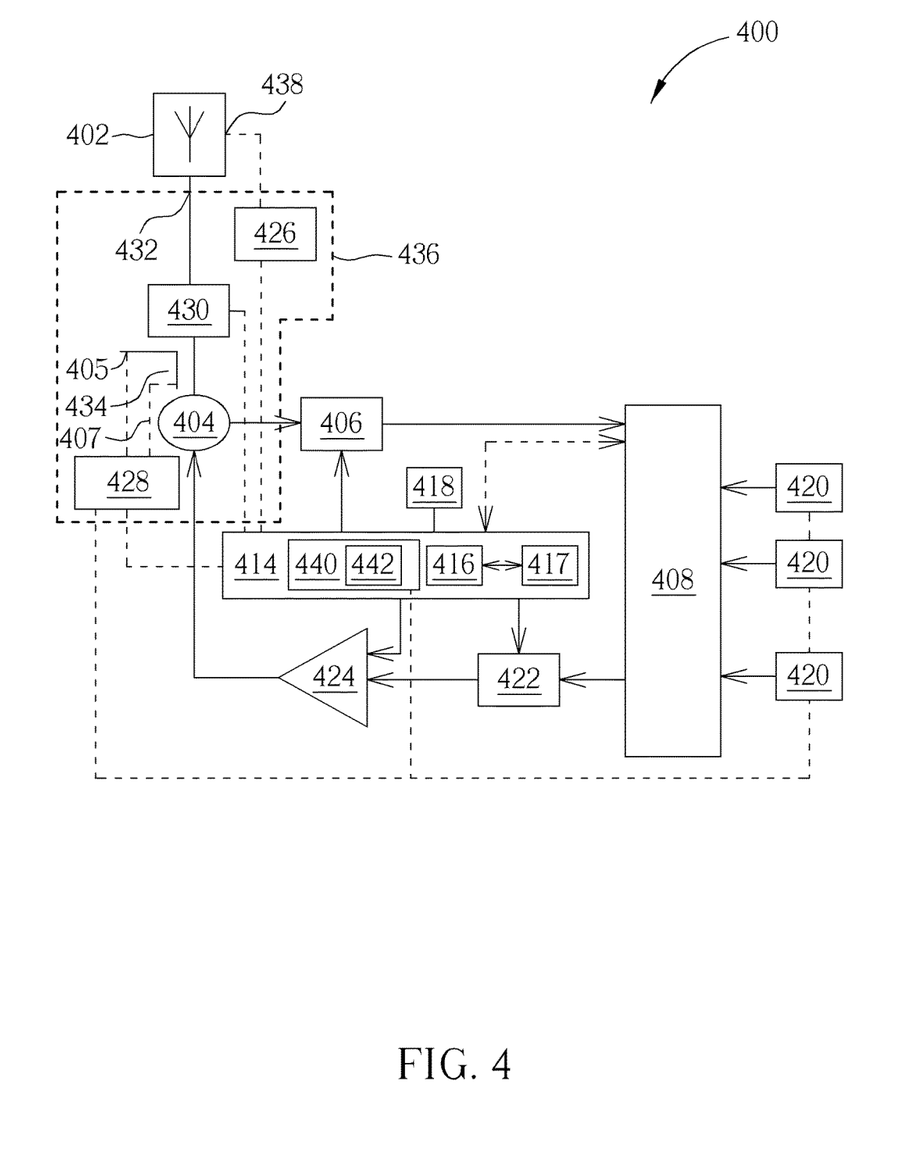
FIG. 4 illustrates an example wireless communication unit comprising an antenna tuner according to example embodiments of the invention.

Referring now to FIG. 4, a block diagram of a wireless communication unit 400, adapted in accordance with some example embodiments of the invention, is shown. In practice, purely for the purposes of explaining embodiments of the invention, the wireless communication unit is described in terms of a wireless subscriber communication unit, such as a user equipment (UE) that in some examples may be a smartphone. In other examples, any wireless device with an antenna, antenna array or antenna arrangement may be used. Hereafter, the term antenna arrangement is used to encompass any type of antenna design.

The wireless communication unit 400 contains an antenna arrangement 402, for radiating or receiving transmissions, coupled to a directional coupler 434 and an antenna switch or duplexer 404 that provides isolation between receive and transmit chains within the wireless communication unit 400. In this example, the coupling of the antenna arrangement 402 with antenna switch or duplexer 404 is made via an impedance matching circuit 430 and antenna input feed point 432. In this example, an aperture tuner 426 is coupled to the antenna arrangement 402, with a coupling port that is located distal from the antenna input feed point 432.

One or more receiver chains is/are coupled to antenna switch or duplexer 404 and include(s) receiver front-end circuitry 406 (effectively providing reception, filtering and intermediate or base-band frequency conversion). The receiver front-end circuitry 406 is coupled to a signal processing module 408 (generally realized by a digital signal processor (DSP)). A skilled artisan will appreciate that the level of integration of receiver circuits or components may be, in some instances, implementation-dependent.

A controller 414 maintains overall operational control of the wireless communication unit 400. The controller 414 is coupled to the receiver front-end circuitry 406 and the signal processing module 408. In some examples, the controller 414 is also coupled to a buffer module 417 and/or a memory device 416 that selectively stores operating regimes, such as antenna tuning information, and the like. A timer 418 is operably coupled to the controller 414 to control the timing of operations (e.g. transmission or reception of time-dependent signals) within the wireless communication unit 400.

The transmit chain includes transmitter/modulation circuitry 422 and a power amplifier 424 coupled to the antenna arrangement 402, which may comprise for example an antenna array, or plurality of antennas. The transmitter/ modulation circuitry 422 and the power amplifier 424 are operationally responsive to the controller 414.

In this example RF measurement module or circuit 428 is connected to a directional coupler 434 that is located between impedance matching circuit 430 and antenna switch or duplexer 404. In other examples, the directional coupler 434 may be directly coupled to the antenna input feed point 432. In this example, directional coupler 434 is arranged to provide both forward 405 and reverse 407 signals to RF measurement module or circuit 428, which is operably coupled to antenna tuning module 440, or another suitable controller or processing module in other examples. The antenna tuning module 440 is arranged to provide a control signal to aperture tuner 426, or initiate a tuning process to be performed by algorithm 442. In some examples, the RF measurement module or circuit 428 measures one or more parameter(s), for example using forward signal 405 and reverse signal 407, that may comprise an indication singly or in combination of at least one of: antenna input complex impedance value, antenna input complex reflection coefficient or reflection coefficient magnitude, related to signals passing through directional coupler 434 to the antenna arrangement 402, say via impedance matching circuit 430.

In this example, a number of the radio frequency components are located on a radio frequency integrated circuit (RF IC) 436. In this example, RF IC 436 comprises the aperture tuner 426 operably couplable to a first port 438 of the antenna arrangement 402; and the measurement circuit 428 operably couplable to the antenna input feed point 432 of the antenna arrangement 402. The measurement circuit 428 is arranged to measure a parameter and the aperture tuner 426 is subjected to closed loop aperture tuning based on the measured parameter. In this example, RF IC 436 may comprise additional components such as directional coupler 434 and antenna switch or duplexer 404. In other examples, RF IC 436 may comprise fewer components than that mentioned above, where such components or circuits, if used, may be introduced in discrete form or on other ICs.

In this example, the aperture tuner 426 and RF measurement module or circuit 428, and in some examples impedance matching circuit 430, are coupled to different ports of the antenna arrangement 402. For example, the antenna input feed point 432 receives the main signal connection, whereas the aperture tuner 426 is connected to another (aperture tuning connection) point 438 within or along the antenna structure, which may form part of the antenna arrangement 402 and is distal from the antenna input feed point 432. In this example, the directional coupler 434 and RF measurement module or circuit 428 are placed as close as possible to antenna input feed point 432, which is distal in a planar perspective (as well as an electrical perspective) from aperture tuning connection point 438.

In one example, RF measurement module or circuit 428 may measure a reflection coefficient value and initiate a trigger signal to controller 414 or antenna tuning module 440 if a sufficiently large change (for example a relative change above a threshold level) in reflection coefficient value is detected. The controller 414 (or antenna tuning module 440 coupled to or associated with controller 414) is operably coupled to the aperture tuner 426 and arranged to perform closed loop aperture tuning in response to the at least one measured parameter. In some examples, RF measurement module or circuit 428 may also be arranged to additionally measure the antenna input complex impedance. In some examples, the controller 414 may also perform impedance matching of impedance matching circuit 430 in response to the at least one measured antenna input complex impedance. In examples, the measured parameter is subsequently used to perform closed loop aperture tuning of aperture tuner 426, and in some examples impedance matching by adjusting components in impedance matching module 430.

In some examples, a first antenna tuning procedure controls/sets one or more adjustable component(s) in aperture tuner 426 to compensate for a frequency resonance shift determined or measured by adjusting a resonance of aperture tuner 426. Further, a second antenna tuning procedure may relate to compensating for an impedance mismatch by adjusting one or more components of impedance matching circuit 430 in order to adjust a perceived input impedance thereof.

In some examples, a frequency resonance shift may be caused by the wireless communication unit 400 changing its frequency of operation, and therein a frequency response of antenna arrangement 402 transmitting or receiving signals on a different frequency band. Here, a measured reflection coefficient value associated with the antenna arrangement 402 operating on the different received frequency band may be utilised by controller 414 as a trigger signal to initiate an aperture tuning operation, say performed by tuning algorithm 442.

In some examples, the signal processing module 408 and/or algorithm 442 in controller 414 may receive inputs from one or more sensor modules 420. In some examples, the one or more sensor module(s) 420 may comprise one or more of: a proximity sensor, accelerometer, barometer or light sensor, such that in response to a sensed signal, for example a signal that exceeds a threshold, the sensor triggers an antenna tuning processing operation, for example performed by antenna tuning module 440.

In some examples, the sensor modules 420 may also be operably coupled to RF measurement module or circuit 428. For example, in response to a measurement made by RF measurement module or circuit 428, one or more of the sensor modules 420 may provide a trigger signal to the algorithm 442 within the antenna tuning module 440, which re-tunes one or more components within, or operably coupled to, antenna arrangement 402. Sensor modules 420 may be operable to sense a user interaction, for example a user holding the wireless communication unit or pressing a button or a touchscreen on the device as the hand of the user holding the wireless communication device may affect the performance of the antenna or sense a position of the wireless communication device, for example using an accelerometer, or sense a change in lighting conditions due, for example, to the user positioning the wireless communication device to their head. In this example, a reduced amount of light, as determined by the wireless communication unit's light sensor, may be indicative of the wireless communication unit 400 being located next to a user's head. In some other examples, a change in a user operating scenario may trigger the algorithm 442 within the controller 414 to perform a closed loop aperture tuning procedure.

In some examples, the algorithm 442 within the controller 414 may receive a trigger signal, which may cause the algorithm 442 to modify the aperture tuner 426 and in some examples the impedance matching module 430, for example in response to the one or more sensor signals.

In some examples, in a multi-band third generation (3G) or fourth generation (4G) radio platform, such an antenna tuning approach may be implemented at the main and diversity and/or multiple input-multiple output (MIMO) antennas. Clearly, the various components within the wireless communication unit 400 can be realized in discrete or integrated component form, with an ultimate structure therefore being application-specific or design-based.

Figure 5:
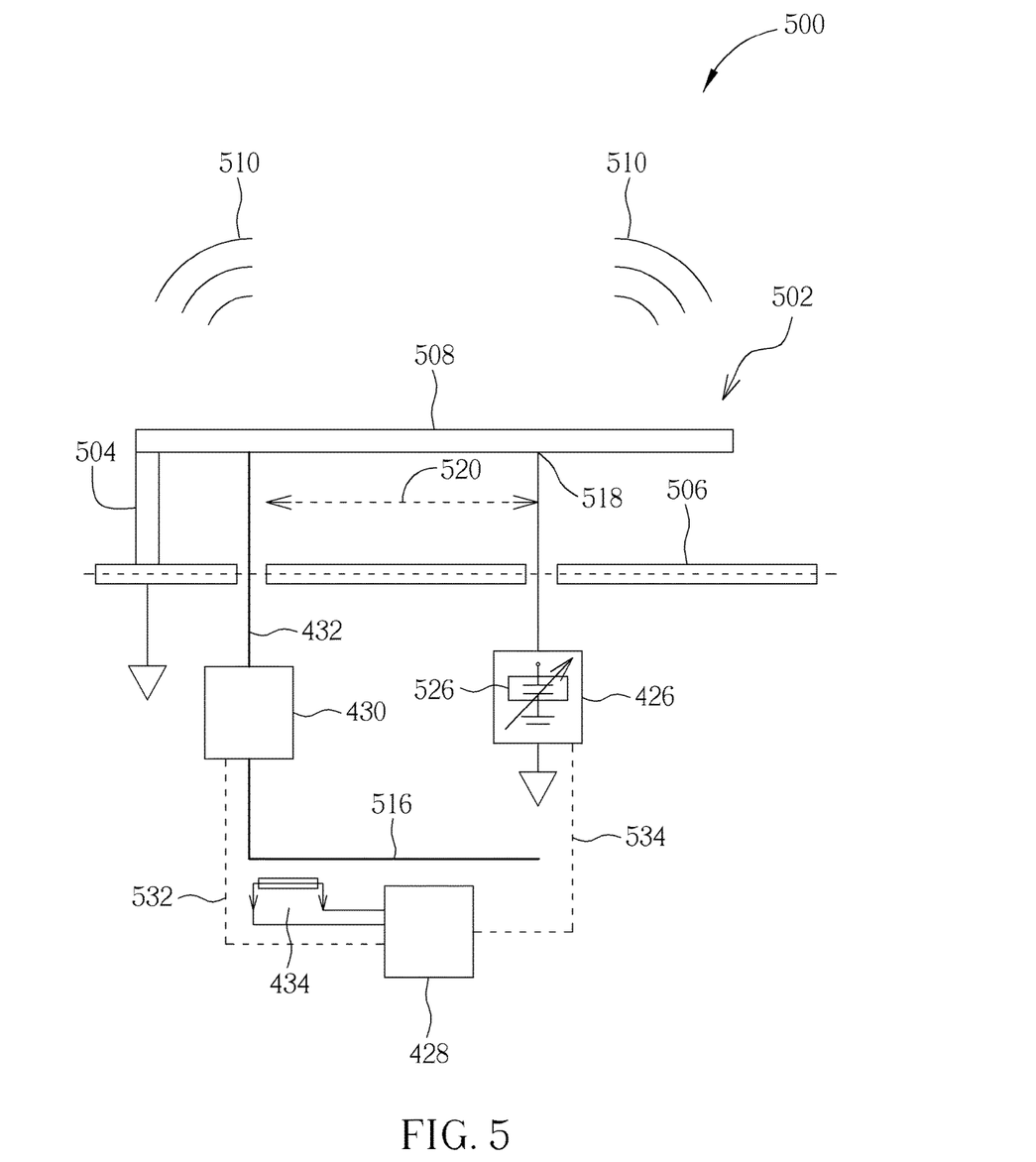
FIG. 5 illustrates an example wireless communication unit comprising an aperture tuner and an impedance matching circuit for a multi-band PIFA.

Referring to FIG. 5, an example of an antenna arrangement 500 for a wireless communication unit is illustrated. In this example, the antenna arrangement 500 comprises a multi-band Planar Inverted F Antenna (PIFA) 502. The multi-band PIFA 502 comprises a shorting pin 504 that couples the multi-band PIFA 502 to a ground plane 506. The multi-band PIFA 502 comprises a radiating element 508 arranged to radiate/receive free space waves 510.

The aperture tuning operation is performed by optimizing the radiation efficiency from the antenna terminals into free space by tuning the aperture. In other examples, the tunable nature of aperture tuner 426 may be implemented by one or more other radio frequency components. In accordance with examples of the invention, the aperture tuner 426 and impedance matching module 430 are notably coupled to different ports of the multi-band PIFA 502 and located distal from one another. For example the main signal connection is coupled to antenna input feed point 432 via impedance matching module 430. In contrast, the aperture tuner 426 is connected to another aperture tuner connection point 518 along or within the antenna structure. The distance 520 between the aperture tuner connection point 518 and the antenna input feed point 432 depends on the antenna design style and the operating frequency range supported by the antenna. For typical multi-band PIFAs used in mobile phones this distance could be in the range of a few millimetres to several centimetres. In other examples, for example when supporting different frequencies or antenna designs, a skilled artisan will appreciate that the ranges may be different.

In some examples, tuneable capacitors may be either voltage controlled or digitally controlled. In this example, the aperture tuning is effected by controlling a digitally tuneable capacitance (DTC) 526 located within the aperture tuner 426 that is electrically coupled to the radiating element 508 at aperture tuner connection point 518. In another example, the aperture tuning may be effected by controlling some other component or circuit of the aperture tuner 426 that is connectable to aperture tuner connection point 518 along or within the antenna structure.

In accordance with examples of the invention, the measurement of one or more parameter(s) associated with the antenna arrangement, for example using forward and reverse extracted signals extracted by directional coupler 434, is performed by RF measurement module or circuit 428. RF measurement module or circuit 428 may then, based on the one or more parameter(s), instigate aperture tuning by providing an aperture tuning control signal 534 to aperture tuner 426. RF measurement module or circuit 428 may also then, based on the one or more parameter(s), instigate impedance matching by providing an impedance matching control signal 532 to manipulate components or circuits that affect an input impedance that is applied by impedance matching module 430.

In this example, impedance matching for the multi-band PIFA 502 is also performed by impedance matching module 430, which presents a suitably adjusted impedance at antenna input feed point 432. The antenna impedance tuning is arranged to optimize power transfer to/from the transmission line 516, e.g. in a form of a guided wave, from/to the antenna element (s) by tuning the impedance matching module 430.

In this manner, a closed loop arrangement is provided whereby the aperture tuning control signal 534, and in some examples the impedance matching control signal 532, is activated in response to the one or more parameter(s) and therefore the prevailing operating condition of the antenna arrangement.

Common implementations for the impedance tuner are standard L (i.e. on series element and one shunt element) or Pi (i.e. one series element with two shunt elements on either side) impedance matching topologies where capacitors are implemented with DTCs and inductors are either fixed or implemented as switched inductors.

In some examples, with reference to the measurement data for a multi-band PIFA illustrated in FIG. 3, it was explained earlier that multiple antenna resonances occur indicated by imag{Zin}~0. Not all of these antenna resonances correspond to states with good antenna efficiency, because for some of these resonances the real part of the antenna input impedance real (Zin) is far from 50Ω, resulting in high mismatch losses at the antenna feed point that are difficult to recover even when adding an impedance tuner. The inventors of the present invention have also proposed a new approach to determining an optimal antenna resonance by avoiding resonance for which the real part of the antenna input impedance is far from 50Ω. In particular, the inventors of the present invention have determined that for optimum antenna frequency tuning, it is not sufficient to search for Im{Zin}~0, but that it is better to perform a minimum measured reflection value search, since this will result in optimum antenna efficiency. In this regard, aperture tuner 426 may be subjected to a series of tuning operations, in accordance with the approach of FIG. 6. Thus, some tuning examples herein described may further address the potential problem with FIG. 2 in choosing a non-optimal resonance in the resonance tuning vs. reflection value tuning graphs, as described with the flowchart of FIG. 6.

Figure 6:
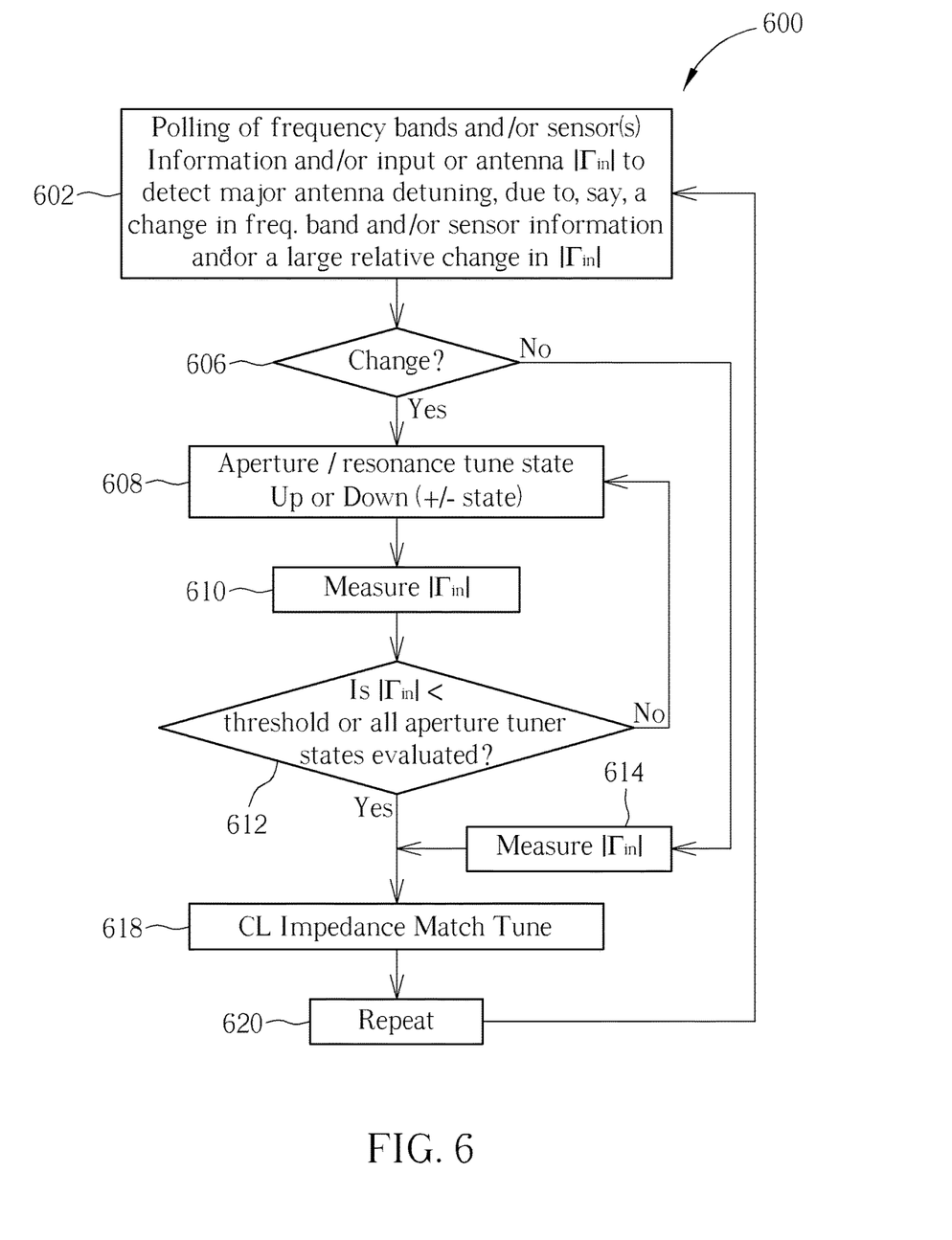
FIG. 6 illustrates an example method of antenna tuning that incorporates aperture tuning and optionally impedance matching for a wireless communication unit according to example embodiments of the invention.

Referring to FIG. 6, an example operation 600 of an antenna tuning circuit, for example the antenna tuning circuit 500 from FIG. 5, is illustrated. Initially, at step 602, an algorithm, for example algorithm 442 from FIG. 4, may interrogate/poll a number of frequency bands to determine whether there is a relatively large change in interrogated frequency bands at step 606. The algorithm may additionally and/or alternatively determine whether there is a relatively large change in sensor information. The algorithm may additionally and/or alternatively determine whether there is a relative change in an antenna measured reflection value |Γ$_{in}$| measured by RF measurement module or circuit 428. At step 606, if there is not a relatively large change in interrogated frequency bands and/or sensor information, and/or measured reflection value, then the process jumps to 614 where the reflection value is measured.

At step 606, if there is a relatively large change in interrogated frequency bands and/or sensor information, and/or measured reflection value, one or more adjustable components or circuits within the aperture tuner is/are tuned at step 608. For example, the tuning may be performed at step 608 by increasing or decreasing one or two tunable capacitors mounted along the antenna body (as illustrated in FIG. 5), in order to determine the correct tuner state to recover the resonance at a certain desired frequency of operation. The reflection value is then measured at step 610. A determination is then made at step 612 as to whether the reflection value measured at step 610 is below a threshold or whether all aperture tuner states have been evaluated. If it is determined at step 612 that the reflection value measured at step 610 is not below a threshold and that all aperture tuner states have not been evaluated, then the process loops back to step 608 and the process repeats. In this manner, iterating the aperture tuner state is stopped when the resulting input reflection is low enough or all available tuner states have been considered.

However, if it is determined at step 612 that the reflection value measured at step 610 is below a threshold or that all aperture tuner states have been evaluated, then the process moves to step 618 and the wireless communication unit may perform a closed loop impedance match/tune operation. The process then repeats in step 620 by looping back to step 602.

Notably, in accordance with example embodiments of the invention, the combination of aperture tuning and additionally impedance tuning is performed in a closed loop (e.g. dynamic) manner. In some examples, an antenna that is determined as being off-resonance is first retuned back to resonance by aperture tuning, thereby providing a coarse tuning operation, before applying impedance tuning (e.g. fine tuning) to correct mismatch loss.

Advantageously, example embodiments of the present invention may remove the known (prior art) need for LUT storage of tuner electric parameter sets based on different tuned antenna states, as determined under open loop conditions. In some example embodiments, it may also remove the known need for frequency bands and sensor information polling, if the antenna impedance relative change can be measured. Furthermore, example embodiments of the present invention may also provide an improved (or indeed optimum) efficiency performance, which may be obtained using closed loop impedance match tuning and aperture tuning.

In some examples, the described closed loop measured reflection value-based approach is performed in response to a trigger that comprises a frequency resonance shift, as determined from a reflection value measurement. The described closed loop measured reflection value-based approach may first select the aperture tuner state that exhibits the best reflection value, based on frequency band change information. In some examples, this 'coarse tuning' approach may provide an efficiency that is close to an optimal case. A second fine tuning operation is then performed using a closed loop impedance match tuning. In some examples, the closed loop impedance match tuning is performed on a continuous re-matching basis, in order to optimize antenna tuner input impedance for optimum antenna performance under free space or human body loading scenarios.

It is envisaged that the aforementioned inventive concept can be applied by a semiconductor manufacturer to any radio frequency module comprising radio frequency components or circuits that include or are operably coupled to any form of antenna arrangement. It is further envisaged that, for example, a semiconductor manufacturer may employ the inventive concept in a design of a stand-alone radio frequency module or application-specific integrated circuit (ASIC) or may implement the any other sub-system element.

However, it will be appreciated by a skilled artisan that the inventive concept herein described may be embodied in any type of communication unit, such as those used in military, civil and land mobile radio applications to tune narrowband antennas over wide frequency ranges. In some examples, the reactive elements may be either variable capacitors or variable inductors and may typically use large and expensive components. For consumer electronic products, there are several device types that are candidates for tunable elements. They fall into two categories: variable capacitors and switches. Variable capacitance devices include varactor diodes, barium-strontiumtitanate (BST) capacitors and MEMS devices. Switches include silicon on insulator (SOI), silicon on sapphire (SOS), gallium arsenide (GaAs) and MEMS devices. Switches may be used with discrete capacitors or inductors to create variable reactances or can be used to connect different antenna structures.

It will be appreciated that any suitable distribution of functionality between different functional units, for example with respect to the components or circuits residing in either the front end module or any transceiver modules, may be used without detracting from the invention. Hence, references to specific functional units are only to be seen as references to suitable means for providing the described functionality, rather than indicative of a strict logical or physical structure or organization.

Although the present invention has been described in connection with some embodiments, it is not intended to be limited to the specific form set forth herein. Rather, the scope of the present invention is limited only by the accompanying claims. Additionally, although a feature may appear to be described in connection with particular embodiments, one skilled in the art would recognize that various features of the described embodiments may be combined in accordance with the invention. In the claims, the term 'comprising' does not exclude the presence of other elements or steps.

Furthermore, although individually listed, a plurality of means, elements or method steps may be implemented by, for example, a single unit or processor. Additionally, although individual features may be included in different claims, these may possibly be advantageously combined, and the inclusion in different claims does not imply that a combination of features is not feasible and/or advantageous. Also, the inclusion of a feature in one category of claims does not imply a limitation to this category, but rather indicates that the feature is equally applicable to other claim categories, as appropriate.

Furthermore, the order of features in the claims does not imply any specific order in which the features must be performed and in particular the order of individual steps in a method claim does not imply that the steps must be performed in this order. Rather, the steps may be performed in any suitable order. In addition, singular references do not exclude a plurality. Thus, references to 'a', 'an' 'first', 'second', etc. do not preclude a plurality.

Thus, an improved wireless communication unit, radio frequency integrated circuit and method of antenna tuning therefor that supports multiple frequency ranges and/or multiple communication standards therefor have been described, wherein the aforementioned disadvantages with prior art arrangements have been substantially alleviated.

What is claimed is:

1. A wireless communication unit comprising:
   an antenna arrangement;
   an aperture tuner operably coupled to a first port of the antenna arrangement;
   a measurement circuit operably coupled to an antenna input feed point of the antenna arrangement that is distal from the first port coupled to the aperture tuner and arranged to measure a parameter that represents an antenna input complex impedance value associated with different resonance conditions of the antenna arrangement;
   an impedance matching module operably coupled to the measurement circuit and the antenna input feed point and arranged to perform impedance matching of complex input signals applied to or emanating from the antenna arrangement; and a controller, operably coupled to the aperture tuner and arranged to perform closed loop control of the aperture tuner in response to the measured parameter of antenna input complex impedance.

2. The wireless communication unit of claim 1 wherein the measurement circuit is arranged to determine whether a change in the antenna input impedance value or the reflection coefficient value exceeds a threshold and in response thereto the controller triggers closed loop control of the aperture tuner.

3. The wireless communication unit of claim 2 wherein the controller is arranged to trigger closed loop control of the aperture tuner additionally based on at least one from a group of: a change of use of the communication unit, a frequency band change.

4. The wireless communication unit of claim 1 wherein the closed loop control of the aperture tuner is performed continuously to optimize antenna tuner input impedance.

5. The wireless communication unit of claim 1 wherein an impedance match value applied by the impedance tuning module is also tuned in a closed loop manner based on the measured parameter.

6. The wireless communication unit of claim 1 wherein the closed loop control of the aperture tuner performs a first coarse tuning operation and impedance tuning performs a second fine tuning operation for signals routed to or from the antenna arrangement.

7. The wireless communication unit of claim 1 further comprising at least one sensor operably coupled to the controller, such that the controller is arranged to initiate antenna input impedance measurements or reflection coefficient measurements performed by the measurement circuit in response to a sensed signal.

8. The wireless communication unit of claim 1 wherein the measurement circuit comprises:
    a directional coupler arranged to extract a portion of the signals being passed to and reflected from the antenna arrangement; and
    a signal detector arranged to provide a measurement of the parameter based on said portion of the signals.

9. A method of antenna tuning in a wireless communication unit comprising an antenna arrangement operably coupled to an aperture tuner; the method comprising:
    routing a signal to or from the antenna arrangement via an antenna input feed point of the antenna arrangement;
    measuring a parameter of the routed signal that represents an antenna input complex impedance value associated with different resonance conditions of the antenna arrangement at a measurement circuit operably coupled to the antenna input feed point of the antenna arrangement;
    performing impedance matching of complex input signals applied to or emanating from the antenna arrangement at an impedance matching module; and
    performing closed loop control of the aperture tuner based on the measured parameter of antenna input complex impedance, wherein the aperture tuner is connected to a first port of the antenna arrangement distal from the antenna input feed point.

10. The method of claim 9 wherein measuring a parameter further comprises determining whether a change in the antenna input impedance value or the reflection coefficient value exceeds a threshold and in response thereto the controller triggers closed loop control of the aperture tuner.

11. The method of claim 10 further comprising:
    determining whether a change in the antenna input impedance value or the reflection coefficient value exceeds a threshold; and
    triggering closed loop control of the aperture tuner in response thereto.

12. The method of claim 9 further comprising triggering closed loop control of the aperture tuner additionally based on at least one from a group of: a change of use of the communication unit, a frequency band change.

13. A radio frequency integrated circuit for a wireless communication unit comprising an antenna arrangement, the radio frequency integrated circuit comprising:
    an aperture tuner operably couplable to a first port of the antenna arrangement; and
    a measurement circuit operably couplable to an antenna input feed point of the antenna arrangement that is distal from the first port coupled to the aperture tuner and arranged to measure a parameter representing an antenna input complex impedance value associated with different resonance conditions of the antenna arrangement; and
    an impedance matching module operably coupled to the measurement circuit and the antenna input feed point and arranged to perform impedance matching of complex input signals applied to or emanating from the antenna arrangement;
    wherein the aperture tuner is subjected to closed loop aperture tuning based on the measured parameter of antenna input complex impedance.

* * * * *